United States Patent [19]
Kucukcakar et al.

[11] Patent Number: 5,600,567
[45] Date of Patent: Feb. 4, 1997

[54] METHOD OF GRAPHICALLY DISPLAYING AND MANIPULATING CLOCK-BASED SCHEDULING OF HDL STATEMENTS

[75] Inventors: Kayhan Kucukcakar, Scottsdale; Rajesh Gupta, Chandler; Thomas Tkacik, Phoenix, all of Ariz.

[73] Assignee: Motorola, Inc., Schaumburg, Ill.

[21] Appl. No.: 333,656

[22] Filed: Nov. 3, 1994

[51] Int. Cl.$^6$ .................................................. G06F 15/00
[52] U.S. Cl. ........................... 364/488; 364/489; 364/578
[58] Field of Search ................................... 364/578, 488, 364/489

[56] References Cited

U.S. PATENT DOCUMENTS 5,111,413  5/1992  Lazansky et al. ...................... 364/578

OTHER PUBLICATIONS

Jerraya, "AMICAL: An interactive high level synthesis environment", European Design Automation Conference, Feb., 1993, pp. 58–63.

*Primary Examiner*—Kevin J. Teska
*Assistant Examiner*—Andrew Roberts
*Attorney, Agent, or Firm*—Robert D. Atkins

[57] ABSTRACT

A scheduling editor graphically displays an algorithmic description and associated scheduling data (14) on a computer terminal (20) to provide a visual representation of the present clock-based timing and scheduling criteria assigned to the algorithmic description. The graphical display and update of scheduling data is performed by software on a computer system. The software allows the algorithmic description to be modified in a user friendly graphical format to edit the timing and scheduling data before the actual circuit schematic is generated. The design database includes control parameters such as selection of clock signal, execution phase of the selected clock, scheduling type, synchronization type, and concurrent operation that dictate how the scheduling is implemented. The software receives new control parameters selected by the designer via the graphic interface and updates the design database accordingly (16). The update alters values in the design database (18) to reflect the present scheduling information.

23 Claims, 1 Drawing Sheet

METHOD OF GRAPHICALLY DISPLAYING AND MANIPULATING CLOCK-BASED SCHEDULING OF HDL STATEMENTS

BACKGROUND OF THE INVENTION

The present invention relates in general to circuit design and, more particularly, to interactive computer-aided design where clock-based scheduling of high-level design language statements are graphically displayed for easy manipulation.

Techniques of computer-aided design are well known and practiced in digital and analog circuit design. A typical process involves identifying a circuit design task and specifying a high-level functional description of the overall circuit function. That functional description may either be manually implemented in a specific circuit design or fed into computer-aided design software that automatically configures the circuit implementation. Additional computer-aided design software takes the computer generated implementation and creates gate-level schematics, layouts, and masks that are sent to a fabrication facility to build the integrated circuit.

The computer-aided design software creates the circuit implementation from a set of rigid design rules whereby a functional description is transformed into a circuit implementation under a predetermined style, i.e. configuration of busses, multiplexers, interconnects and registers and selection of functional units. For example, if the high-level functional description includes an addition operation in one area and a subtraction operation in another area, a conventional computer-aided design software may pull an adder from its library and implement it in the circuit schematic and then pull a subtractor from its library and implement it in another area of the circuit schematic to perform each operation. In some applications having a large number of such addition and subtraction operations it is preferable to share adders and subtractors for addition and subtraction operations, or use a more complex general purpose arithmetic logic unit instead of using numerous dedicated adders and subtractors. Unfortunately, the designer typically does not have control over whether the computer-aided design software selects the general purpose arithmetic logic unit or a plurality of individual arithmetic components. In the prior art the designer has often been forced to accept whatever circuit implementation is dictated by the logic of the computer-aided design software. Since the architectural design of many circuits is as much an art as a science it is desirable to allow the designer more control and flexibility over the actual implementation of the circuit from the high-level descriptive language.

The computer-aided design software known in the prior art generally involves a mapping step where the functional description is transformed into a structural layout. A scheduling process must also be defined to determine which functional steps are performed in which order. For example, in a synchronous digital design it may be necessary to perform certain mathematical calculations to determine intermediate results before the next mathematical calculations that use those results are performed. A scheduling control circuit provides the appropriate enable signals and clock signals to the circuit schematic to perform the mathematical calculations in the correct order to achieve the desired result. For applications that require very precise control over the scheduling of the circuit operations, it is often necessary for the designer to put detailed timing and control instructions within the functional description to ensure that the operations are performed in the correct order. Otherwise, the computer-aided design software may produce inappropriate ordering that may produce undesired results and occasionally the implementation may actually be incorrect. The scheduling control in the functional description may become impractical or at least cumbersome for complex loops, conditional statements and pipe-lining.

Hence, a need exists for a method of allowing interaction between the designer and computer-aided design software so that the designer may exercise control over particular implementations of a functional description.

DETAILED DESCRIPTION OF THE PREFERRED EMBODIMENT

Figure 1:
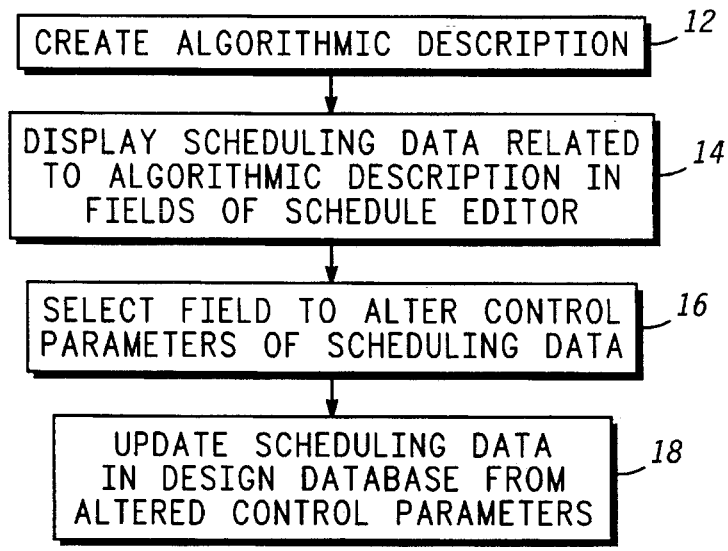
FIG. 1 illustrates a flow diagram of graphically displaying and updating scheduling data in a design database.

Referring to FIG. 1, the steps of creating and updating an algorithmic description of a circuit are shown. In step 12, the designer creates an algorithmic description of the circuit using for example a hardware description language (HDL) that describes the desired operation of the circuit from a high level. For example, a simple algorithmic description may comprise HDL statements as follows:

```
input A, B, C
if (A) then {
    B = B + 1;
    C = C + 2;
} else {
    C = C + 1;
}
D = B + C;
E = A + 1;
```

The above algorithm is a high-level description of the function that a circuit may perform to achieve some desired result. The circuit inputs values for A, B and C. In the first operation, if the parameter (A) is true then the circuit increments the value of B by one and stores the result back in the value B. In addition, the circuit increments the value C by two and stores the result back in the value C. If the value of A is not true then the circuit increments the value of C by one, and stores the result back in the value C. Once the above steps were accomplished the circuit adds B and C to achieve a new value D. The circuit increments the value of A by one to provide a new value E.

The above algorithm is processed through an architectural design capture system, i.e. computer-aided design software, that processes the high-level description into detailed circuit schematics that may be further processed through layout and interconnect software necessary to build a mask and fabricate the integrated circuit in an appropriate foundry. Part of the process of converting the algorithm to a schematic implementation is a scheduling task in which control, clocking, sequencing, and other scheduling data are specified. The scheduling data is necessary to precisely define how elements of the algorithmic description are executed by order and time.

In the prior art, scheduling information and constraints are incorporated into the algorithmic description of the above HDL statements as follows:

```
input A, B, C
parallel begin
{
    -- Parallel branch one
    if (A) then {
        B = B + 1;
        C = C + 2;
    } else {
        wait for positive edge of clock1;
        C = C + 1;
    }
    wait for negative edge of clock2;
    D = B + C;
}
{
    -- Parallel branch two
    wait for positive edge of clock1;
    E = A + 1;
}
parallel end
```

The above algorithm is a high-level description of the function that a circuit may perform to achieve some desired result. The timing and scheduling information must be specified to make a complete functional description which can be manufactured. The circuit inputs values for A, B and C. The parallel begin statement causes parallel branch one and parallel branch two to be performed simultaneously. In the first operation, if the parameter (A) is true then the circuit increments the value of B by one and stores the result back in the value B. In addition, the circuit increments the value C by two and stores the result back in the value C. If the value of A is not true then the circuit waits for the next positive edge of clock1, increments the value of C by one, and stores the result back in the value C. Once the above steps are accomplished the circuit waits for the next negative edge of clock2, and adds B and C to achieve a new value D. In the second parallel branch, the circuit waits for the next positive edge of clock1 and increments the value of A by one to provide a new value E.

As noted in the background, prior art computer-aided designing software required that the specific clock-based timing and scheduling criteria be manually inserted into the algorithmic description before it was processed through the architectural design system. The manual input of timing and scheduling data is cumbersome, tedious and error prone.

As part of the present invention, the first algorithmic description and its associated scheduling data are displayed in graphical form, for example on a computer terminal, so as to provide the designer with a visual representation of the present clock-based timing and scheduling data assigned to the algorithmic description. The graphical display and update of scheduling data is performed by software on a computer system. The software allows the algorithmic description to be modified in a user friendly graphical format to edit the clock-based timing and scheduling data in the algorithmic description before the actual circuit schematic is generated. A design database is linked to the computer-aided design software and includes control parameters that dictate how the clock-based scheduling is implemented. The control parameters include criteria such as selection of clock signal, execution phase of the selected clock, scheduling type, synchronization type, concurrent operation, etc. The graphic interface allows the designer to observe the present setting of the control parameters and make changes though the graphic interface to easily and efficiently alter the scheduling data. The software receives new control parameters from the designer via the graphic interface and updates the design database accordingly. The update alters values in memory locations of the computer system to reflect the present scheduling information.

Figure 2:
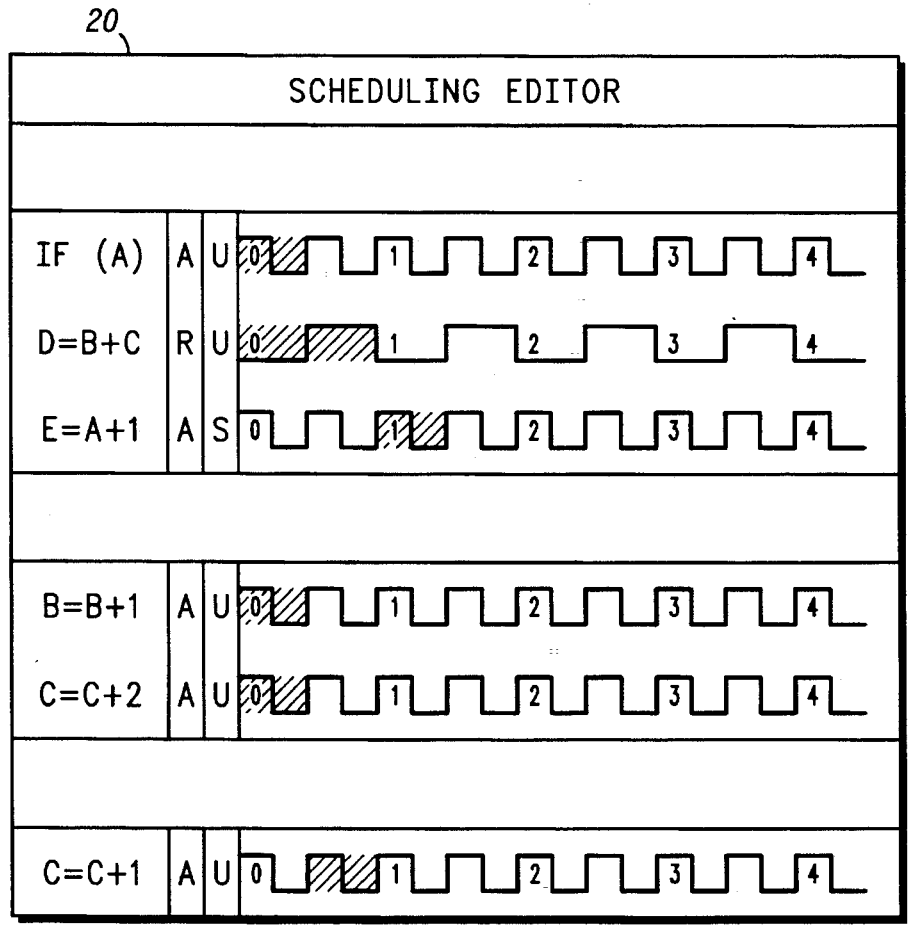
FIG. 2 illustrates a graphical user interface display.

In step 14, a schedule editor brings up the algorithmic description on a computer screen (20) that displays the scheduling data. The scheduling data may be graphically observed for interactive updates and corrections. An example of the scheduling editor is shown in FIG. 2 with statements from the algorithmic description and its presently assigned scheduling data. Each statement of the algorithmic description includes a graphic field for the scheduling type (e.g. "A" for absolute or "R" for relative), synchronization type (e.g. "S" for synchronized or "U" for unsynchronized), and a graphic field that illustrates the selected clock and the cycles where execution begins.

Although FIG. 2 is a black and white image, it is preferable to use colors on the computer display and highlight the selected information in bright colors against a neutral background. For example, the present scheduling type and synchronization type may be white against a brown background while the selected clock phase where execution takes place may be shaded in green. The statements within the algorithmic description may be highlighted in different colors to show reference points and dependencies to clearly present the conditions that need to be satisfied to obtain a correct and efficient schedule. Other options of highlighting may include bolding the letters underlining and using various shades of cross-hatch, gray scales and many other techniques in order to graphically and visually represent the present state of the clock-based scheduling of the algorithmic description.

In step 16 of FIG. 1 the designer selects a particular graphic field displayed in the schedule editor to alter the scheduling data associated with that field. For example, the designer may place the computer controlled cursor on the scheduling type and change it from absolute to one or more types of relative scheduling. The designer uses a mouse-type device to point and click at a particular field to change its data. The software accepts the entry from the designer and makes appropriate corrections in the design database to reflect the new status of the scheduling data pertaining to the algorithmic description. If the schedule type has changed from absolute to relative, appropriate updates are made to the design database to reflect the new scheduling data. The update involves altering values in memory locations of the computer system to reflect the present scheduling information. In other embodiments, pull down menus may be used to select various options for the selected field, or to make request to display more detailed information about selected fields.

Consider the algorithmic description provided in HDL statements as presented in FIG. 2. When the scheduling data is first presented the clock field is typically blank and must be selected from a menu of options. The designer selects the graphic field, requests the option menu, and selects the desired clock from one of several possible clock signals to assign to that clock field. In addition, the clock cycles representing the execution time are selected. In general, the operation may be assigned to begin executing on the rising or falling edge of the respective clock signal. For example, the statement "if (A)" is selected to operate off clock1 and starts executing during the first cycle of clock1 as shown in FIG. 2. The D=B+C statement is selected to operate off clock2 and starts executing during the first cycle of clock2. Likewise, the statement E=A+1 is assigned to operate with clock1 and starts executing during the third cycle of the first clock signal. Note that the relative scheduling statements shown in FIG. 2 have different time line origins than the absolute scheduling statements. The clock field may easily be updated by selecting the field on the graphic display and choosing another option from the menu. Each update to the clock field, both in selecting the clock signal and the cycle of execution, is reflected in the design database as per step 18. Thus, the scheduler allows editing of the scheduling data associated with each one of the graphic fields.

In one embodiment, the scheduling type may default to absolute scheduling since that is a commonly used type. In absolute scheduling, execution begins at a predetermined time. To modify the scheduling type the scheduling field is selected to present a menu of the options in the scheduling field. Other options include relative scheduling types where the execution time is determined relative to completion of other statements such that the execution time of the statement is determined at run time as early as possible. The statement D=B+C is chosen to have a relative scheduling type which means it begins executing as soon as possible after the composite "if (A)" statement completes. The beginning execution time for clock2 in the statement D=B+C lines up under the beginning time for the "if (A)" statement only because the time bases between relative and absolute schedule differ. The execution time for the statement D=B+C actually begins after the "if (A)" statement completes. The scheduling editor may include a synchronized type field for each entry in the algorithmic description. The synchronizing field is selected in the case where it is desired to have the statement synchronized with respect to other clocks.

Another feature shown in FIG. 2 is a hierarchy of HDL statements where the nested statements B=B+1 and C=C+2 are shown on another portion of the screen, or in actual practice for more complicated designs on a separate screen, to represent a hierarchical format for the algorithmic description. To traverse down in the hierarchy of a particular statement, for example the "if (A)" statement, the designer pulls down a menu option, or selects a pop-up window, on the schedule editor and selects a lower hierarchy. The scheduling information for entries B=B+1 and C=C+2 is displayed on a separate screen or on another portion of the present screen. The scheduling information for establishing clock cycles and execution phases as well as scheduling type may be entered and updated as described above. The alternate "else" nesting of the "if" statement may also be viewed on a lower hierarchy screen. The clock field and scheduling type field are entered and modified by selecting the fields and assigning clocks and execution phases and scheduling types from menu options.

The C=C+1 is shown operating under control of clock1 and set to execute during the second cycle of that first clock signal. Accordingly the design database is updated such that the else statement is required to wait for the next positive edge of clock1 before executing the C=C+1 statement.

Statements of the algorithmic description may be selected to execute concurrently by the scheduling editor. The statement B=B+1 and C=C+2 are selected as shown in FIG. 2 to operate off clock1 and begin executing during the first cycle of clock1. Hence, the design database is provided information that those statements are to be scheduled concurrently.

By now it should be appreciated that the present invention provides a schedule editor that graphically displays an algorithmic description on a computer terminal so as to provide the designer with a visual representation of the present clock-based timing and scheduling criteria assigned to the algorithmic description. The software allows the algorithmic description to be modified in a user friendly graphical format to edit the clock-based timing and scheduling data in the algorithmic description before the actual circuit schematic is generated. The graphic interface allows the designer to observe the present setting of the control parameters and make changes through the graphic interface to easily and efficiently alter the scheduling data. The software receives new control parameters from the designer via the graphic interface and updates the design database accordingly.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

What is claimed is:

1. A computer implemented method of editing a design database, comprising the steps of:

displaying an algorithmic description of a circuit functionality from the design database on a display screen in graphic fields;

displaying scheduling data from the design database associated with said algorithmic description in said graphic fields;

selecting one of said graphic fields; and altering said scheduling data associated with said algorithmic description in said one of said graphic fields.

2. The method of claim 1 further including the step of updating said altered scheduling data in the design database.

3. The method of claim 2 wherein said selecting step includes the step of selecting a first clock signal.

4. The method of claim 3 wherein said altering step includes the step of changing said first clock signal to a second clock signal.

5. The method of claim 4 wherein said updating step includes the steps of replacing said first clock signal in the design database with said second clock signal.

6. The method of claim 3 wherein said selecting step further includes the step of selecting a first execution cycle of said first clock signal.

7. The method of claim 6 wherein said altering step includes the step of changing said first execution cycle of said first clock signal to a second execution cycle of said first clock signal.

8. The method of claim 7 wherein said updating step further includes the step of replacing said first execution cycle of said first clock signal in the design database with said second execution cycle of said first clock signal.

9. The method of claim 2 wherein said selecting step further includes the step of selecting a first type of scheduling.

10. The method of claim 9 wherein said altering and updating steps further include the steps of:

changing said first type of scheduling to a second type of scheduling; and replacing said first type of scheduling in the design database with said second type of scheduling.

11. The method of claim 2 wherein said selecting step further includes the step of selecting a first type of synchronization.

12. The method of claim 11 wherein said altering and updating steps further include the steps of:

changing said first type of synchronization to a second type of synchronization; and replacing said first type of synchronization in the design database with said second type of synchronization.

13. A method of displaying scheduling information, comprising the steps of:

reading scheduling data related to synchronous timing of a digital circuit design; and displaying said scheduling data in graphic fields on a display screen that provides a hierarchical graphic representation of scheduling and clocking of the digital circuit design.

14. The method of claim 13 further including the steps of:

providing an algorithmic description of a circuit functionality;

selecting one of said graphic fields; altering said scheduling data associated with said algorithmic description in said one of said graphic fields; and updating said altered scheduling data in a design database.

15. The method of claim 14 further including the steps of:

selecting a first clock signal;

changing said first clock signal to a second clock signal; and replacing said first clock signal in said design database with said second clock signal.

16. The method of claim 15 further including the steps of:

selecting a first execution cycle of said first clock signal;

changing said first execution cycle of said first clock signal to a second execution cycle of said first clock signal; and replacing said first execution cycle of said first clock signal in said design database with said second execution cycle of said first clock signal.

17. The method of claim 14 further including the steps of:

selecting a first type of scheduling;

changing said first type of scheduling to a second type of scheduling; and replacing said first type of scheduling in said design database with said second type of scheduling.

18. The method of claim 14 further including the steps of:

selecting a first type of synchronization;

changing said first type of synchronization to a second type of synchronization; and replacing said first type of synchronization in said design database with said second type of synchronization.

19. A method of displaying and updating a design database, comprising the steps of:

providing an algorithmic description of a circuit functionality;

displaying said algorithmic description on a display screen in graphic fields for human interaction;

reading scheduling data related to synchronous timing from the design database;

displaying said scheduling data from the design database associated with said algorithmic description in said graphic fields;

interactively selecting one of said graphic fields;

altering said scheduling data associated with said algorithmic description; and updating said altered scheduling data in the design database.

20. The method of claim 19 further including the steps of:

selecting a first clock signal;

changing said first clock signal to a second clock signal; and replacing said first clock signal in the design database with said second clock signal.

21. The method of claim 20 further including the steps of:

selecting a first execution cycle of said first clock signal;

changing said first execution cycle of said first clock signal to a second execution cycle of said first clock signal; and replacing said first execution cycle of said first clock signal in the design database with said second execution cycle of said first clock signal.

22. The method of claim 19 further including the step of:

selecting a first type of scheduling;

changing said first type of scheduling to a second type of scheduling; and replacing said first type of scheduling in the design database with said second type of scheduling.

23. The method of claim 19 further including the steps of:

selecting a first type of synchronization;

changing said first type of synchronization to a second type of synchronization; and replacing said first type of synchronization in the design database with said second type of synchronization.

* * * * *